United States Patent
Wu

(10) Patent No.: US 11,315,632 B2
(45) Date of Patent: Apr. 26, 2022

(54) MEMORY DRIVE DEVICE

(71) Applicants: Jiangsu Advanced Memory Technology Co., Ltd., Jiangsu (CN); Jiangsu Advanced Memory Semiconductor Co., Ltd., Jiangsu (CN); ALTO MEMORY TECHNOLOGY CORPORATION, Hsinchu County (TW)

(72) Inventor: Jui-Jen Wu, Hsinchu County (TW)

(73) Assignees: JIANGSU ADVANCED MEMORY TECHNOLOGY CO., LTD., Jiangsu (CN); JIANGSU ADVANCED MEMORY SEMICONDUCTOR CO., LTD., Jiangsu (CN); ALTO MEMORY TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 17/255,434

(22) PCT Filed: Jun. 27, 2018

(86) PCT No.: PCT/CN2018/092995
§ 371 (c)(1),
(2) Date: Dec. 23, 2020

(87) PCT Pub. No.: WO2020/000231
PCT Pub. Date: Jan. 2, 2020

(65) Prior Publication Data
US 2021/0272628 A1 Sep. 2, 2021

(51) Int. Cl.
*G11C 11/00* (2006.01)
*G11C 13/00* (2006.01)

(52) U.S. Cl.
CPC ........ *G11C 13/004* (2013.01); *G11C 13/0004* (2013.01); *G11C 13/0038* (2013.01); *G11C 13/0069* (2013.01)

(58) Field of Classification Search
CPC ............. G11C 13/004; G11C 13/0004; G11C 13/0038; G11C 13/0069
(Continued)

(56) References Cited

U.S. PATENT DOCUMENTS

| | | | |
|---|---|---|---|
| 2002/0041531 A1* | 4/2002 | Tanaka ................ | G11C 11/4074 365/205 |
| 2009/0051416 A1* | 2/2009 | Ibuka ........................ | G05F 3/08 327/538 |
| 2018/0316325 A1* | 11/2018 | Sakai ....................... | H03F 1/086 |

FOREIGN PATENT DOCUMENTS

| | | |
|---|---|---|
| CN | 101814317 A | 8/2010 |
| CN | 105304116 A | 2/2016 |
| CN | 108022617 A | 5/2018 |

* cited by examiner

*Primary Examiner* — Vu A Le
(74) *Attorney, Agent, or Firm* — CKC & Partners Co., LLC

(57) ABSTRACT

Disclosed is a memory drive device. The memory drive device comprises a control circuit, a reference voltage generation circuit, and a first switch. The control circuit is used to generate a first signal according to an input signal. The reference voltage generation circuit comprises a reference resistor and is used to generate a reference signal according to the first signal. The first switch is coupled to a memory resistor and is used to generate a drive signal according to the first signal so as to set a resistance value of the memory resistor. When the input signal is decreased and a resistance value of the memory resistor is greater than a (Continued)

resistance value of the reference resistor, the time when the drive signal is decreased is greater than the time when the reference signal is decreased.

10 Claims, 8 Drawing Sheets

(58) Field of Classification Search
USPC .......................................................... 365/148
See application file for complete search history.

MEMORY DRIVE DEVICE

BACKGROUND

Technical Field

The present disclosure relates to a memory drive device. More particularly, the present disclosure relates to a driving device of a phase change memory.

Description of Related Art

Existing memory technologies, such as dynamic random access memory (DRAM) and static random access memory (SRAM), have matured and now face physical limits. Therefore, the development of new memory technologies to meet future memory applications is an important research topic in the current related field.

In the memory technology, memorative memory includes a phase change memory (PCM), which can change the resistance value of the element by the crystal phase change of the material itself, and store the information with the change of the resistance value. When the material of the memory element is in a crystalline state, it exhibits a low resistance value, whereas when it is in an amorphous state, it exhibits a high resistance value, thereby storing data such as "1" or "0".

For example, the memorative memory must perform a set write in (SET) or reset write in (RESET) operation through a corresponding drive voltage/current. However, the existing memory driving circuit cannot adaptively adjust the voltage of the driving operation in response to the resistance value of the phase change memory, which causes the crystal phase change to be incomplete during the writing operation. Therefore, how to design a driving circuit suitable for memorative memory to adjust the voltage of the driving operation in response to the resistance value of the phase change memory is one of the current important research and development topics, and it has become an urgent need for improvement in related fields.

SUMMARY

An aspect of the present disclosure is to provide a memory drive device. The memory drive device includes a control circuit, a reference voltage generation circuit, and a first switch. The control circuit is configured to generate a first signal according to an input signal. The reference voltage generation circuit includes a reference resistance. The reference voltage generation circuit is configured to generate a reference signal according to the first signal. The first switch is coupled to a memory resistor, in which the first switch is configured to generate a driving signal according to the reference signal to set a resistance value of the memory resistor. When the input signal is decreased and the resistance value of the memory resistor is larger than a resistance value of the reference resistance, a falling time of the driving signal is longer than a falling time of the reference signal.

In some embodiments, wherein the control circuit comprises: a second switch, a current source, a capacitor, and an amplifier. A first end of the inverter is configured to receive the input signal. A control end of the second switch is coupled to a second end of the inverter, and a first end of the second switch is coupled to a working voltage. A first end of the amplifier, a first end of the capacitor, a first end of the current source and a second end of the second switch are coupled to a first node.

In some embodiments, wherein the control circuit comprises: an inverter, wherein a first end of the inverter is configured to receive the input signal, and a second end of the inverter is coupled to a control end of a second switch.

In some embodiments, wherein the reference voltage generation circuit further comprises: a third switch, wherein a control end of the third switch is coupled to an output end of the amplifier, a first end of the third switch is coupled to the working voltage; wherein a first end of the reference resistance, a second end of the amplifier and a second end of the third switch is coupled to a second node.

In some embodiments, wherein a control end of the first switch is coupled to an output end of the amplifier, a first end of the first switch is coupled to the working voltage, a second end of the first switch and a first end of the memory resistor is coupled to a third node.

In some embodiments, wherein when the input signal is a first voltage level, the inverter generates a second voltage level according to the first voltage level, so as to conduct the second switch, the working voltage is transmitted to the first node through the second switch, and when the first node is the first voltage level, the output end of the amplifier outputs the second voltage level, so as to conduct the first switch and the third switch.

In some embodiments, when the second switch is turned on, the working voltage charges the capacitor through the second switch, and when the second switch is turned off, an electric charge stored in the capacitor is discharged through a current source, so as to decrease a voltage value of the first node, when a voltage value of the first node is decreased, a voltage value of an output end of the amplifier is increased, a resistance value of the first switch and a resistance value of a third switch are increased, so as to decrease a voltage value of a second node and a voltage value of a third node.

In some embodiments, further comprising: a feedback circuit, configured to generate a compare signal according to the reference signal and the driving signal; wherein the control circuit controls a voltage value of the first signal according to the compare signal.

In some embodiments, wherein a first end of the feedback circuit receives the reference signal, a second end of the feedback circuit receives the driving signal, and an output end of the feedback circuit is coupled to the control circuit.

In some embodiments, wherein the control circuit comprises a fourth switch, which is configured to adjust a discharge current flowing through the fourth switch in correspondence to the compare signal.

In some embodiments, wherein the control circuit comprises a second switch, a fourth, a current source, a capacitor, and an amplifier. A control end of the second switch is coupled to the input signal, and a first end of the second switch is coupled to a working voltage. A first end of the current source is coupled to a second end of the fourth switch. A first end of the amplifier, a first end of the capacitor, a first end of the fourth switch, and a second end of the second switch are coupled to a first node. The output end of the feedback circuit is coupled to a control end of the fourth switch.

In some embodiments, wherein the control circuit comprises: an inverter, a first end of the inverter receives the input signal, a second end of the inverter is connected to the control end of the second switch.

In sum, embodiments of this disclosure are to provide a memory drive device, and in particular, a driving device of a phase change memory, so as to adjust the voltage value of the falling time duration and the falling time of the driving voltage of the write in operation according to the resistance value of the phase change memory. In addition, the memory drive device of the present disclosure can self-correct the falling time of the driving voltage of the write in operation and the voltage value of the falling time duration to optimize the driving waveform of the write operation, and thereby improve the reliability and success rate of the write in operation.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure. In addition, in accordance with industry standards and practices, drawings are intended only for the purpose of auxiliary instructions and are not based on the original dimensions, and in fact the dimensions of the various features can be arbitrarily increased or reduced for illustration purposes. The same components in the following instructions will be indicated by the same symbol for easy understanding.

The terminology used herein is for the purpose of describing particular embodiments only and is not intended to be limiting of the disclosure. Some of the words used to describe this revelation will be discussed below or elsewhere in this specification to provide additional guidance from the skilled in the art in the description of this revealing.

It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "coupled" may also be termed as "electrically coupled," and the term "connected" may be termed as "electrically connected." "Coupled" and "connected" may also be used to indicate that two or more elements cooperate or interact with each other. In addition, although the terms such as "first", "second" are used as a description of a different element, which is used only to distinguish the component or operation described in the same technical term. Unless clearly specified in the context, the term is not a particular lying or insinuating order or sub-position, nor is it intended to limit the present invention.

Figure 1:
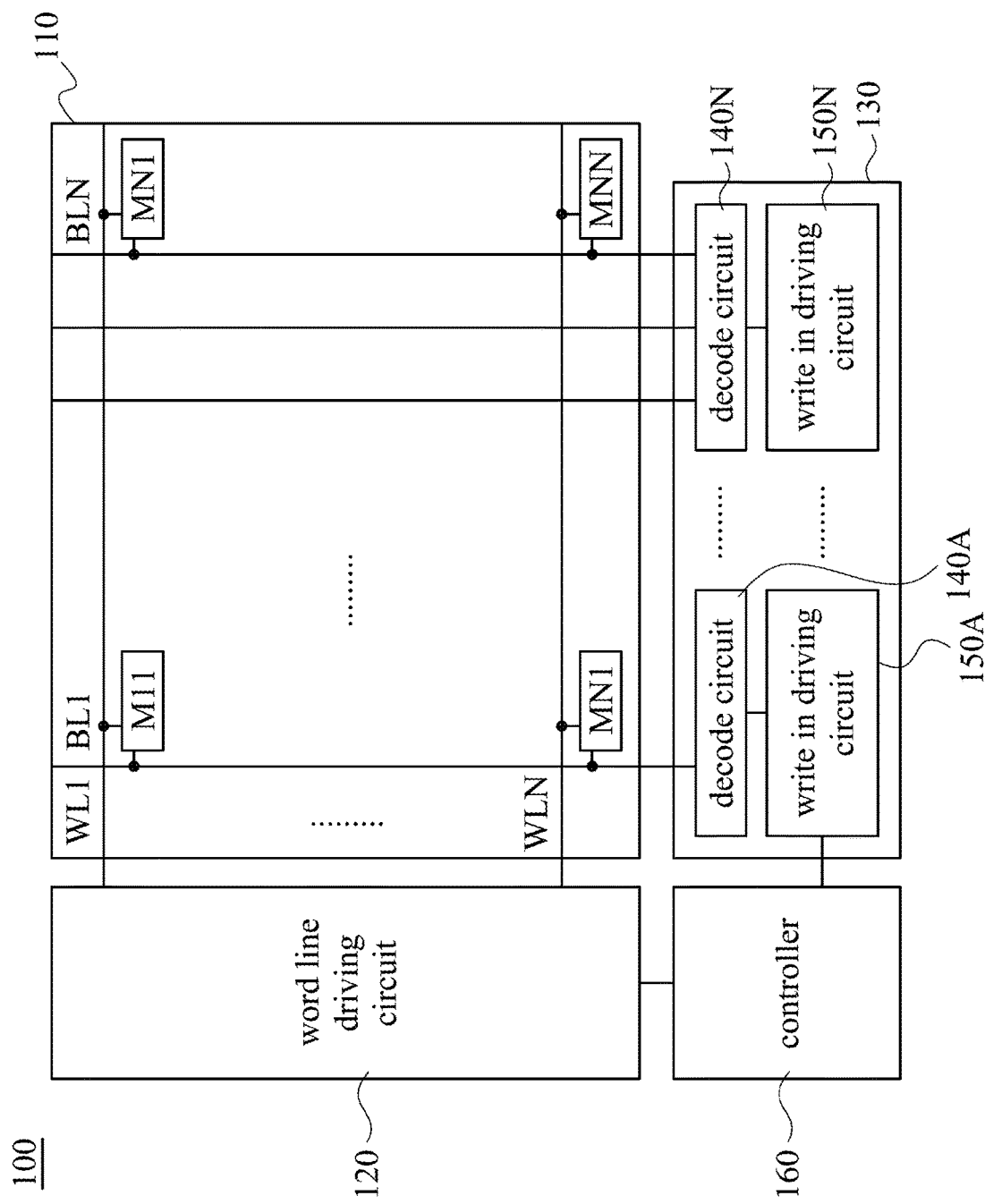
FIG. 1 is a schematic diagram of a memory device according to some embodiments of the present disclosure.

Reference is made to FIG. 1. FIG. 1 is a schematic diagram of a memory device 100 according to some embodiments of the present disclosure. Take phase change memory (PCM) for example, as shown in FIG. 1, the memory device 100 includes a memory array 110 composed of several word lines WL1 to WLN and several bit lines BL1 to BLN, the word line driving circuit 120, the bit line driving circuit 130, and the controller 160. The bit line driving circuit 130 includes several decode circuits 140A to 140N and several write in driving circuits 150A to 150N.

In the connection relationship, the controller 160 is coupled to the word line driving circuit 120 and the bit line driving circuit 130. The word line driving circuit 120 is coupled to several word lines WL1 to WLN. The bit line driving circuit 130 is coupled to several bit lines BL1 to BLN. In detail, several write in driving circuits 150A to 150N are coupled to the controller 160, each of the several decode circuits 140A to 140N is coupled to one of the several write in driving circuits 150A to 150N, and each of the decode circuits 140A to 140N is coupled to part of the bit lines BL1 to BLN. Furthermore, the memory array 110 includes several memory units M11 to MNN. Each of the several memory units M11 to MNN is coupled to a corresponding bit line of the several bit lines BL1 to BLN and a corresponding word line of the several word lines WL1 to WLN.

Each of the several memory units M11 to MNN includes a memory layer (not shown). The memory layer is composed of specific materials, in which this particular material can have different electrical properties based on external operating conditions that change its internal element state (eg, crystalline/amorphous, magnetic, etc.). Thus, according to the different electrical properties (eg, resistance, magnetoresistance, etc.) presented by the memory layer, the memory units M11 to MNN may store different data equivalently. For example, in some embodiments, the memory units M11 to MNN may be phase change random access memory units, in which the memory layer may be implemented by a material such as a chalcogenide, but is not limited thereto. At different operating temperatures, the memory layer has different crystalline states to store different data equivalently.

The above types of memory units M11 to MNN and their implementation materials are only examples. Other forms of memory that can be used to implement memory units M11 to MNN, such as variable resistance random access memory (ReRAM), magnetoresistive random access memory (MRAM), etc., are within the disclosure of the present disclosure.

Reference is made to FIG. 1 again. The decode circuits 140A to 140N are configured to control a switch of the memory layer. When one of the decode circuits 140A to 140N is turned on, one of the memory units M11 to MNN is selected equivalently. Under such condition, the bias voltage/current is applied to the memory layer of the one of the memory units M11 to MNN selected through the corresponding bit line, so as to change the element condition of the memory layer.

The number of the bit lines BL1 to BLN, the word lines WL1 to WLN and the memory units M11 to MNN mentioned above in FIG. 1 are for illustrative purposes only, and the embodiments of the present disclosure are not limited thereto.

For ease of explanation, the following paragraphs are described with the phase change memory unit implementation for memory units M11 to MNN, but as mentioned earlier, the memory units M11 to MNN in the present disclosure are not limited to the phase change memory unit.

Figure 2:
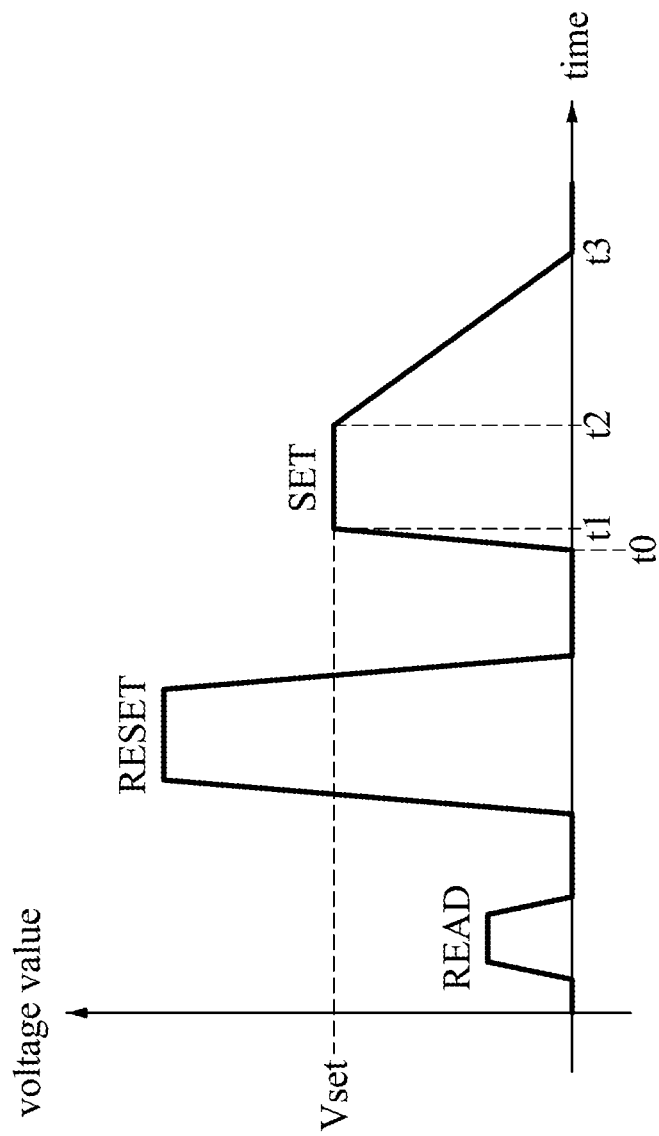
FIG. 2 is an operation status diagram of a memory unit according to some embodiments of the present disclosure.

Reference is made to FIG. 2. FIG. 2 is an operation status diagram of memory units M11 to MNN according to some embodiments of the present disclosure.

As illustrated in FIG. 2, when reading the memory units M11 to MNN, a read pulse wave READ is applied to the memory units M11 to MNN, and the current of the memory units M11 to MNN may be determined whether the stored data is data "1" or data "0".

In addition, if a reset write pulse RESET is applied to the memory units M11 to MNN, the operating voltage of the memory units M11 to MNN will increase at a high speed, and the temperature of the phase change material of the memory units M11 to MNN will increase to melt the phase change material, and then the operating voltage is went down fast, which causes the phase change material R1 to be amorphous. Under these conditions, the memory units M11 to MNN include high resistance values.

On the other hand, if the write pulse SET is applied to the memory units M11 to MNN, as the voltage of the write pulse SET increases, the operating temperature of the memory layer of the memory units M11 to MNN exceeds a certain temperature within a certain period of time and that causes the element state of the layer to be crystalline. Under these conditions, memory units M11 to MNN include low resistance values.

In detail, as shown in FIG. 2, the write in pulse SET includes a rise time duration, a maintenance time duration, and a falling time duration. In the rise time duration t0 to t1, the write in pulse SET voltage value rises rapidly to the set value Vset at time duration t0 to t1. In the time duration t1 to t2, the voltage value of the write in pulse SET is maintained at set value Vset. In the time duration t2 to t3, the value of the write in pulse SET decreases to zero at a slower rate. It is known from the physics that during the current flows, a heating effect is applied to the phase change material. When the voltage value of the write in pulse SET is the set value Vset, the temperature causes the phase change material to crystallize, and the slow cooling helps the material to be in a stable crystalline state so that the phase change material maintains a low resistance value. That is to say, when the falling time duration of the write in pulse SET is longer, the memory units M11 to MNN can be better crystallized and thus reaches a lower resistance value.

Figure 3:
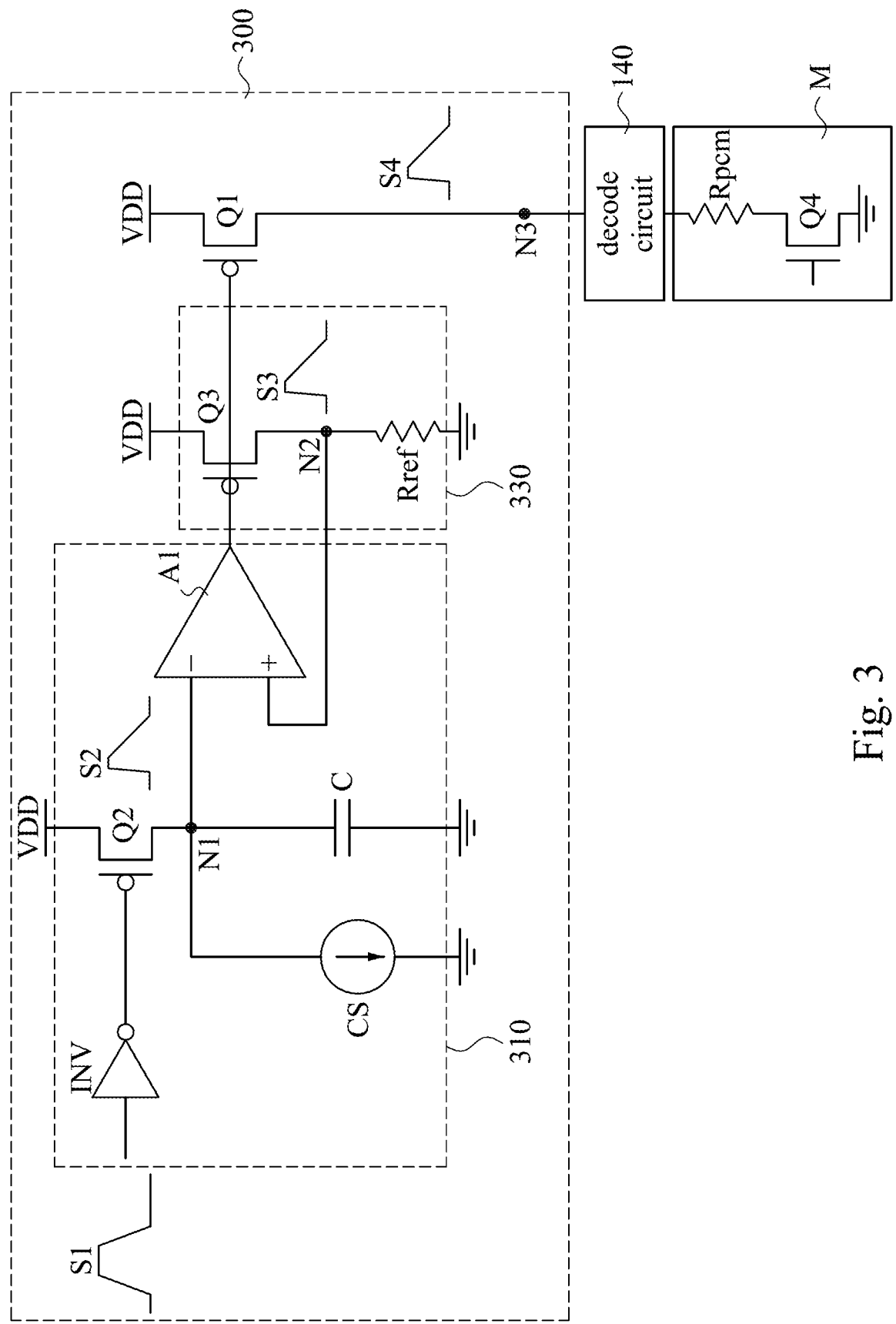
FIG. 3 is a schematic diagram of a write in driving circuit in accordance with some embodiments of the present disclosure.

Reference is made to FIG. 3. FIG. 3 is a schematic diagram of a write in driving circuit 300 in accordance with some embodiments of the present disclosure. As illustrated in FIG. 3, the write in driving circuit 300 is coupled to the decode circuit 140, and the decode circuit 140 is coupled to the memory unit M. The write in driving circuit 300 as shown in FIG. 3 may be the write in driving circuits 150A to 150N in FIG. 1, and the decode circuit 140 may be one of the decode circuits 140A to 140N in FIG. 1, and the memory unit M can be one of the memory units M11 to MNN in FIG. 1.

The memory unit M includes a switch Q4 and a memory resistor Rpcm. The memory resistor Rpcm can be a resistor formed by a write operation or a rewrite operation for an element of the memory layer in the memory unit M.

The write in driving circuit 300 includes a control circuit 310, a reference voltage generation circuit 330, and a switch Q1. The reference voltage generation circuit 330 includes a reference resistance Rref. In the connection relationship, the control circuit 310 is coupled to the reference voltage generation circuit 330, the reference voltage generation circuit 330 is coupled to the switch Q1, and the switch Q1 is coupled to the memory unit M.

In operational relationship, the control circuit 310 is configured to generate a first signal S2 according to the input signal S1. The reference voltage generation circuit 330 is configured to generate the reference signal S3 according to the first signal S2. The switch Q1 is configured to generate a driving signal S4 according to the reference signal S3 to read/write the memory resistor Rpcm. When the resistance value of the memory resistor Rpcm is larger than the resistance value of the reference resistance Rref, the falling time duration of the driving signal S4 is longer than the falling time duration of the reference signal S3.

In some embodiments, as illustrated in FIG. 3, the control circuit 310 includes an inverter INV, a switch Q2, a current source CS, a capacitor C, and an amplifier A1. In the connection relationship, the first end of the inverter INV is configured to receive the input signal S1. The control end of the switch Q2 is coupled to the second end of the inverter INV, and the first end of the switch Q2 is coupled to the working voltage VDD. The first end of the amplifier A1, the first end of the capacitor C, the first end of the current source CS, and the second end of the switch Q2 are coupled to the node N1. The second end of the capacitor C and the second end of the current source CS are coupled to the ground.

In some embodiments, the reference voltage generation circuit 330 also includes a switch Q3. In the connection relationship, the control end of the switch Q3 is coupled to the output end of the amplifier A1, the first end of the switch Q3 is coupled to the working voltage VDD, the second end of the switch Q3, the first end of the reference resistance Rref, and the second end of the amplifier A1 are coupled to node N2, and the second end of the reference resistance Rref is coupled to ground. In short, the output end of the amplifier A1 is coupled to the second end of amplifier A1 via the feedback of the switch Q3. Thus the amplifier A1 forms a negative feedback configuration, so the voltage behavior on the node N2 is equivalent to the voltage behavior on the node N1.

In some embodiments, the control end of the switch Q1 is coupled to the output end of the amplifier A1, the first end of the switch Q1 is coupled to the working voltage VDD, and the second end of the switch Q1 and the first end of the memory resistor Rpcm are coupled to the node N3.

Figure 4:
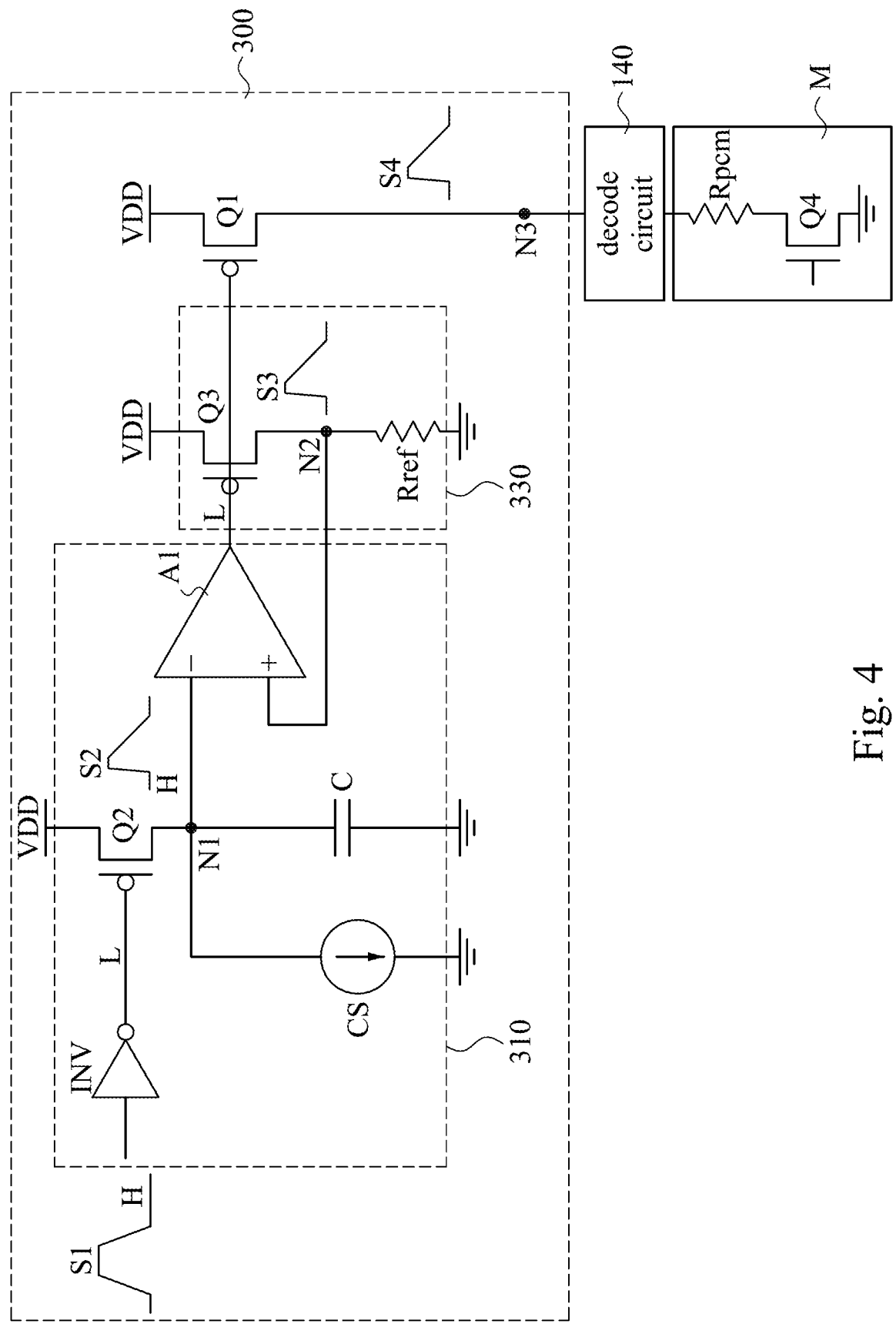
FIG. 4 is an operation diagram of a write in driving circuit in accordance with some embodiments of the present disclosure.
Figure 5:
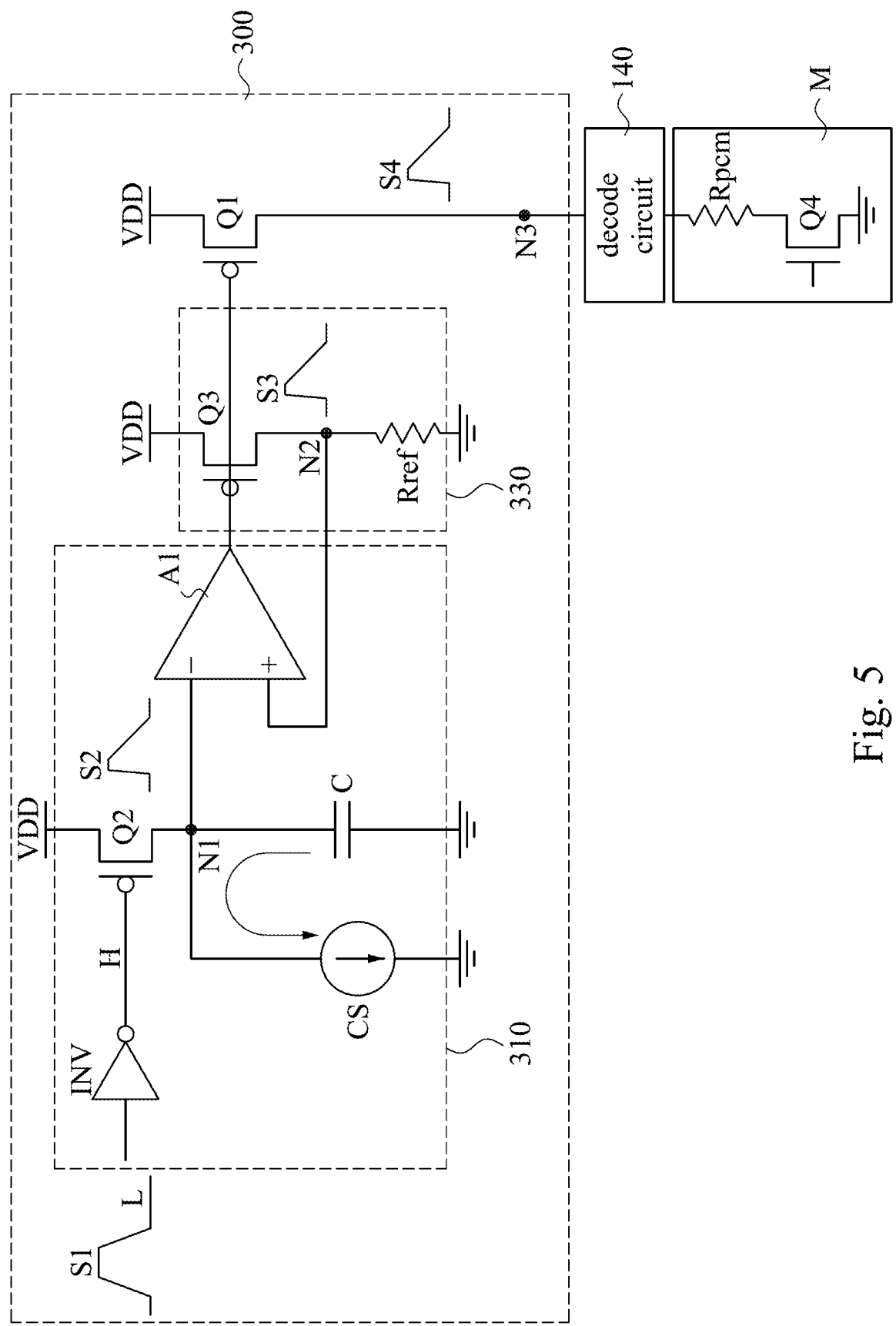
FIG. 5 is an operation diagram of a write in driving circuit in accordance with some embodiments of the present disclosure.

The detailed operation of the write in driving circuit 300 will be described below with reference to FIG. 4 and FIG. 5. FIG. 4 is an operation diagram of a write in driving circuit 300 in accordance with some embodiments of the present disclosure. FIG. 5 is an operation diagram of a write in driving circuit 300 in accordance with some embodiments of the present disclosure. It should be noted that, for convenience of description, the following description will be described with the switches Q1 to Q3 being P-type transistors, but the embodiments of the present invention are not limited thereto.

Reference is made to FIG. 4. When the input signal S1 is the maintain time duration of write in pulse SET, the input signal S1 is a high voltage level. At this time, the inverter INV generates a low voltage level according to the high voltage level. Since the control end of the switch Q2 is a low voltage level, the switch Q2 is turned on. After the switch Q2 is turned on, the working voltage VDD is transmitted to the node N1 via the switch Q2 to charge the capacitor C. Therefore, the node N1 is a high voltage level. When node N1 is a high voltage level, the output end of the amplifier A1 outputs a low voltage level. Since the control ends of the switch Q1 and the switch Q3 are both low voltage levels, the switch Q1 and the switch Q3 are turned on. After the switch Q1 and the switch Q3 are turned on, the working voltage VDD is transmitted to the node N2 and the node N3 via the switch Q1 and the switch Q3.

Reference is made to FIG. 5. When the input signal S1 is the falling time duration of the write in pulse SET, the voltage level of the input signal S1 gradually decreases. When the input signal S1 is a low voltage level, the inverter INV generates a high voltage level according to the low voltage level. Since the control end of the switch Q2 is a high voltage level, the switch Q2 is turned off. At this time, the electric charge stored in the capacitor C is discharged via the current source CS, and the voltage value of the node N1 is gradually decreased. As the voltage value of the node N1 gradually decreases, the voltage value of the output end of the amplifier A1 gradually increases. Since the voltage value of the control end of the switch Q1 and the switch Q3 gradually increases, the equivalent resistance value of the switch Q1 and the switch Q3 gradually becomes larger, and the voltage values of the node N2 and the node N3 gradually become smaller.

In detail, since the amplifier A1 can be regarded as a voltage follower in the write in driving circuit 300, the voltage value of the node N2 is the same as the voltage value of the node N1. That is, the node N2 reflects the voltage value of the node N1 such that the voltage value of the reference signal S3 of the node N2 is the same as the voltage value of the first signal S2 of the node N1.

Next, assuming that switch Q1 is the same as switch Q3, since switch Q1 and switch Q3 receive the same output voltage from the output end of amplifier A1, switch Q1 and switch Q3 can be considered to include the same equivalent resistance value. When the input signal S1 is in the falling time duration of the write in pulse SET, if the resistance value of the memory resistor Rpcm is the same or slightly smaller than the resistance value of the reference resistance Rref, the voltage value of the driving signal S4 of the node N3 is the same as the reference signal S3 of the node N2. On the other hand, if the resistance value of the memory resistor Rpcm is greater than the resistance value of the reference resistance Rref, the voltage value of the driving signal S4 of the node N3 is greater than the voltage value of the reference signal S3 of the node N2.

Figure 7:
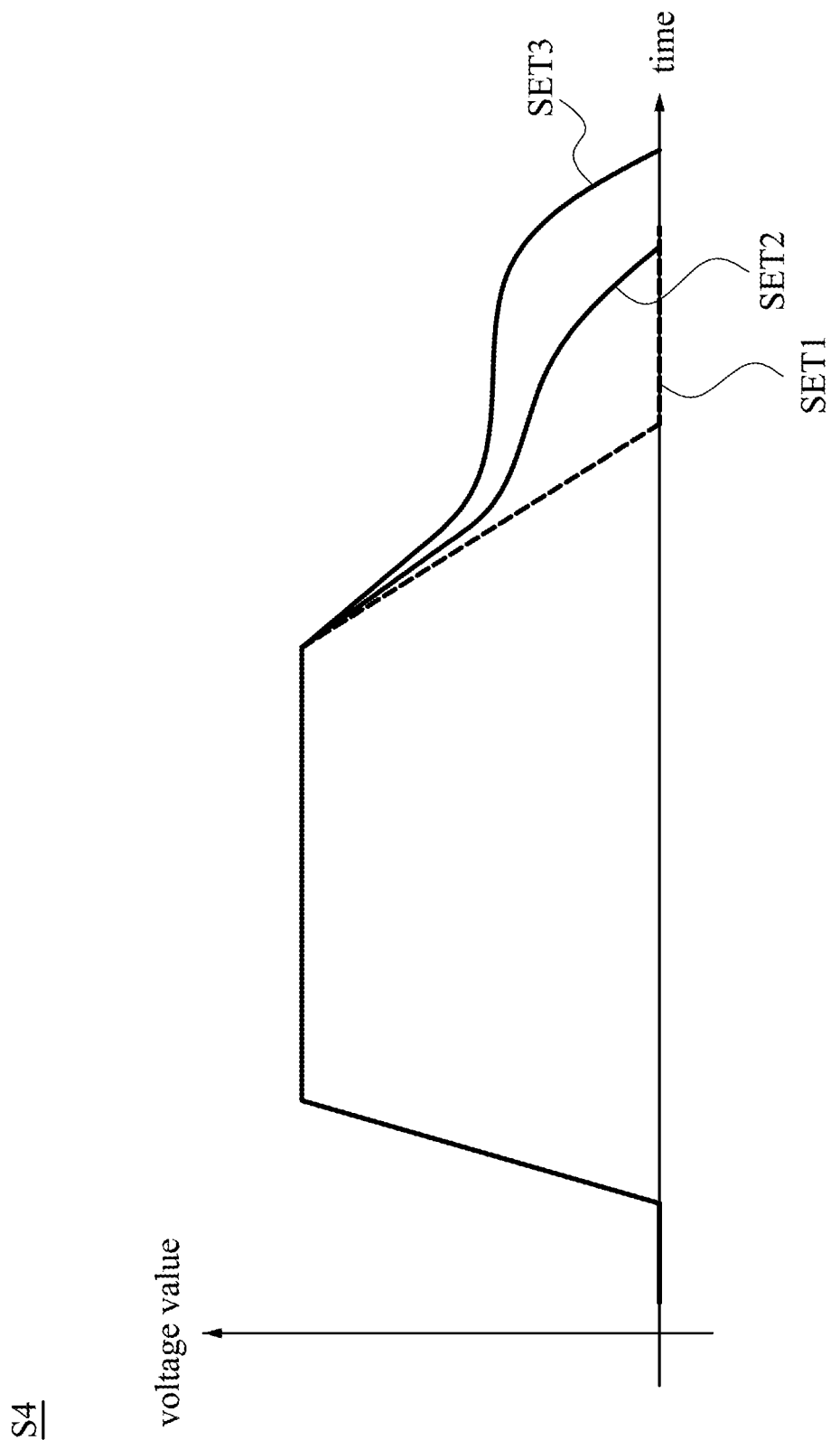
FIG. 7 is an experimental data diagram of a driving signal in accordance with some embodiments of the present disclosure.

FIG. 7 is an experimental data diagram of a driving signal S4 in accordance with some embodiments of the present disclosure. As shown in FIG. 7, it is assumed that the pulse of the first signal S2 is as shown by the pulse SET1. In the embodiment of the write in driving circuit 300, when the resistance value of the memory resistor Rpcm is greater than the resistance value of the reference resistance Rref, the pulse of the driving signal S4 is shown as pulse SET2, and the pulse of the reference signal S3 is the same as first signal S2. That is, the falling time duration of the driving signal S4 is longer than the falling time duration of the reference signal S3, and during the falling time duration, the voltage value of the driving signal S4 is higher than the voltage value of the reference signal S3.

In this way, the driving signal S4 can set the memory resistor Rpcm with a higher voltage value and extend the falling time of the write in pulse SET so that the memory resistor Rpcm can achieve a better crystallization state. As the memory resistor Rpcm gradually reaches a better crystalline state, the resistance value of the memory resistor Rpcm gradually decreases, and the voltage value of the node N3 also decreases.

Figure 6:
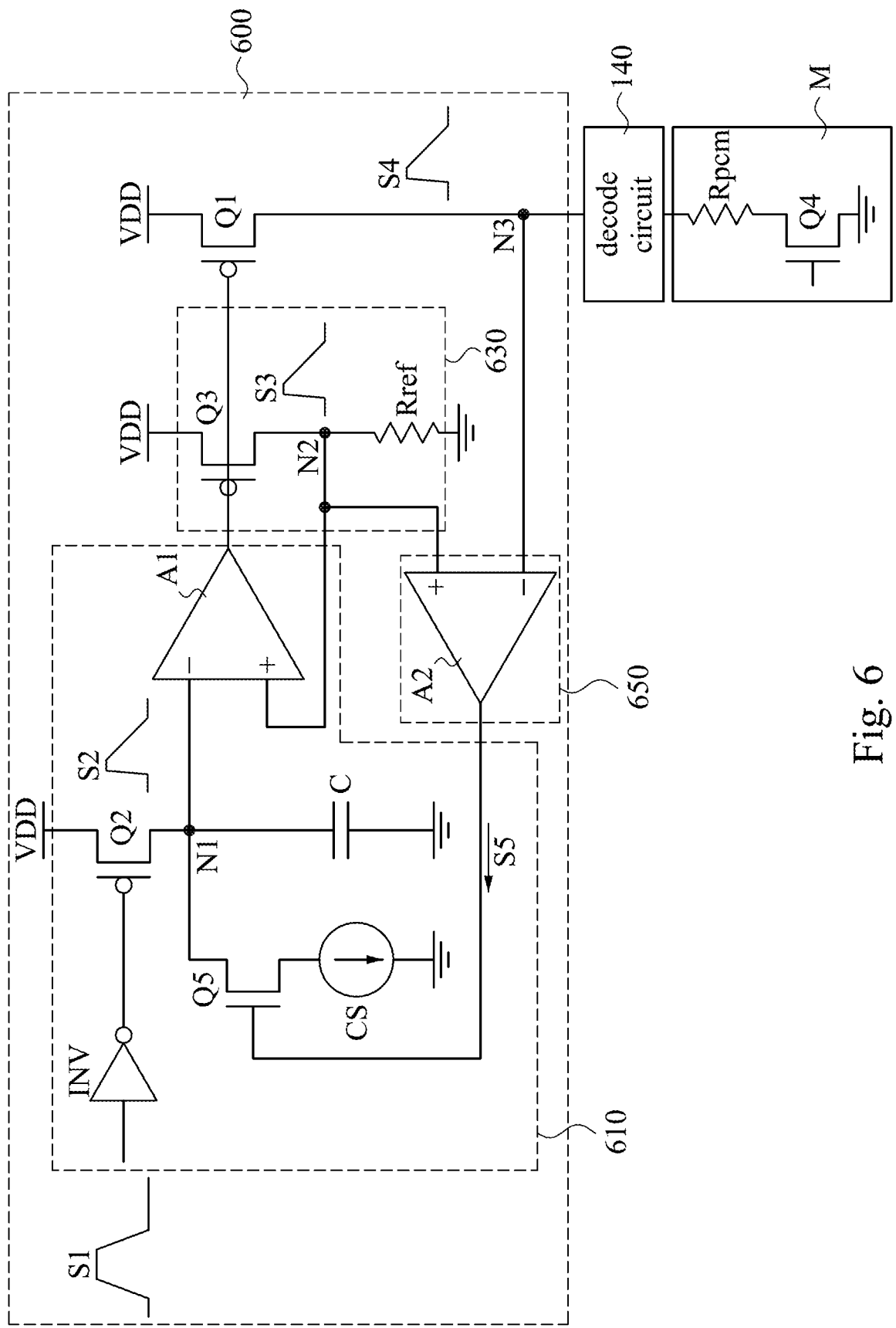
FIG. 6 is an operation diagram of a write in driving circuit in accordance with some embodiments of the present disclosure.

Reference is made to FIG. 6 again. FIG. 6 is an operation diagram of a write in driving circuit 600 in accordance with some embodiments of the present disclosure. As shown in FIG. 3, the write in driving circuit 600 is coupled to the decode circuit 140, and the decode circuit 140 is coupled to the memory unit M. The write in driving circuit 600 as shown in FIG. 6 may be the write in driving circuits 150A to 150N in FIG. 1, and the decode circuit 140 may be one of the decode circuits 140A to 140N in FIG. 1, and the memory unit M can be one of the memory units M11 to MNN in FIG. 1.

The write in driving circuit 600 includes a control circuit 610, a reference voltage generation circuit 630, a feedback circuit 650, and a switch Q1. In the connection relationship, the control circuit 610 is coupled to the reference voltage generation circuit 630, the reference voltage generation circuit 630 is coupled to the switch Q1, the switch Q1 is coupled to the memory unit M, and the feedback circuit 650 is coupled to the control circuit 610, the reference voltage Generation circuit 630 and switch Q1.

In the operational relationship, the control circuit 610 is configured to generate the first signal S2 according to the input signal S1. The reference voltage generation circuit 630 is configured to generate the reference signal S3 according to the first signal S2. The switch Q1 is configured to generate a driving signal S4 according to the reference signal S3 to read/write memory resistor Rpcm. The feedback circuit 650 is configured to generate a compare signal S5 according to the reference signal S3 and the driving signal S4, and to output a compare signal S5 to the control circuit 610. The control circuit 610 is further configured to control the voltage value of first signal S2 according to the compare signal S5. When the input signal S1 is decreased and the resistance value of the memory resistor Rpcm is larger than the resistance value of the reference resistance Rref, the falling time of the driving signal S4 is longer than the falling time of the reference signal S3.

In some embodiments, as shown in FIG. 6, the control circuit 610 includes an inverter INV, a switch Q2, a current source CS, a capacitor C, an amplifier A1, and a switch Q5. In the connection relationship, the first end of the inverter INV is configured to receive the input signal S1, and the output end of the amplifier A1 is coupled to the reference voltage generation circuit 630. The control end of the switch Q2 is coupled to the second end of the inverter INV, and the first end of the switch Q2 is coupled to the working voltage VDD. The first end of the amplifier A1, the first end of the capacitor C, the first end of the switch Q5, and the second end of the switch Q2 are coupled to the node N1. The second end of the switch Q5 is coupled to the first end of the current source CS. The second end of the capacitor C and the second end of the current source CS are coupled to the ground.

It should be noted that, for convenience of illustration, in FIG. 6, the switches Q1 to Q3 are P-type transistors, and the switch Q5 is an N-type transistor. However, the embodiments of the present invention are not limited thereto.

The connection method and detailed structure of the switch Q1 and the reference voltage generation circuit 630 are substantially the same as those of the switch Q1 and the reference voltage generation circuit 330 in FIG. 3, and the description thereof will not be repeated.

In some embodiments, the feedback circuit 350 includes a comparator A2. In the connection relationship, the first end of the comparator A2 is coupled to the node N2, the second end of the comparator A2 is coupled to the node N3, and the output end of the comparator A2 is coupled to the control end of the switch Q5.

In the operational relationship, the first end of the comparator A2 receives the reference signal S3, and the second end of the comparator A2 receives the driving signal S4. After comparing the reference signal S3 with the driving signal S4, the comparator A2 generates a compare signal S5, and then the output end of the comparator A2 outputs a compare signal S5 to the control circuit 610. The switch Q5 adjusts the discharge current flowing through the switch Q5 corresponding to compare signal S5.

In detail, when the input signal S1 is the maintain time duration of the write in pulse SET, the input signal S1 is a high voltage level. At this time, the inverter INV generates a low voltage level according to the high voltage level. Since the control end of the switch Q2 is a low voltage level, the switch Q2 is turned on. After the switch Q2 is turned on, the working voltage VDD is transmitted to the node N1 via the switch Q2 and charges the capacitor C. At this time, the node N1 is a high voltage level. When the node N1 is a high voltage level, the output end of the amplifier INV outputs a low voltage level. Since the control ends of the switch Q1 and the switch Q3 are both low voltage levels, the switch Q1 and the switch Q3 are turned on. After the switch Q1 and the switch Q3 are turned on, the working voltage VDD is transmitted to the node N2 and the node N3 via the switch Q1 and the switch Q3.

On the other hand, when the input signal S1 is the falling time duration of the write in pulse SET, the voltage level of the input signal S1 gradually decreases. When the input signal S1 is a low voltage level, the inverter INV generates a high voltage level according to the low voltage level. Since the control end of the switch Q2 is a high voltage level, the switch Q2 is turned off. At this time, the electric charge stored on the capacitor C is discharged by the current source CS through the switch Q5, and the voltage value of the node N1 is gradually decreased. As the voltage value of the node N1 gradually decreases, the voltage value of the output end of the amplifier INV gradually increases. Since the voltage value of the control end of the switch Q1 and the switch Q3 gradually increases, the equivalent resistance value of the switch Q1 and the switch Q3 gradually becomes larger, and the voltage values of the node N2 and the node N3 gradually become smaller.

When the resistance value of the memory resistor Rpcm is larger than the resistance value of the reference resistance Rref, the reference signal S3 is smaller than the driving signal S4, and the voltage value of the compare signal S5 is thus smaller. At this time, the voltage value of the control end of the switch Q5 is low, so that the conduction degree of the switch Q5 is low, and the current flowing through the voltage source CS is small. As a result, the voltage value of the first signal S2 of the node N1 decreases at a slower speed, and the voltage value of the driving signal S4 of the node N3 decreases at a slower speed, and further the driving signal S4 has a longer falling time duration After the better crystallization of the memory resistor Rpcm, the voltage value of the memory resistor Rpcm is lowered. At this time, the voltage value of the driving signal S4 of the node N3 is decreased, and the voltage value of the compare signal S5 is high. At this time, the voltage value of the control end of the switch Q5 is high, and thus the conduction degree of the switch Q5 is high, so that the current flowing through the voltage source CS is large until the voltage value of the node N1 falls to zero.

Reference is made to FIG. 7. As shown in FIG. 7, it is assumed that the pulse of the first signal S2 is as shown by the pulse SET1. In the embodiment of the write in driving circuit 600, when the resistance value of the memory resistor Rpcm is larger than the resistance value of the reference resistance Rref, the pulse of the driving signal S4 is shown as pulse SET3, and the pulse of the reference signal S3 is the same as the first signal S2. That is, the falling time duration of the driving signal S4 is longer than the falling time duration of the reference signal S3, and at the falling time duration, the voltage value of the driving signal S4 is higher than the voltage value of the reference signal S3. Furthermore, compared to the embodiment of the write in driving circuit 300, the falling time duration of the write in driving circuit 600 is longer, and the driving signal S4 has a slower voltage dropping rate.

Figure 8:
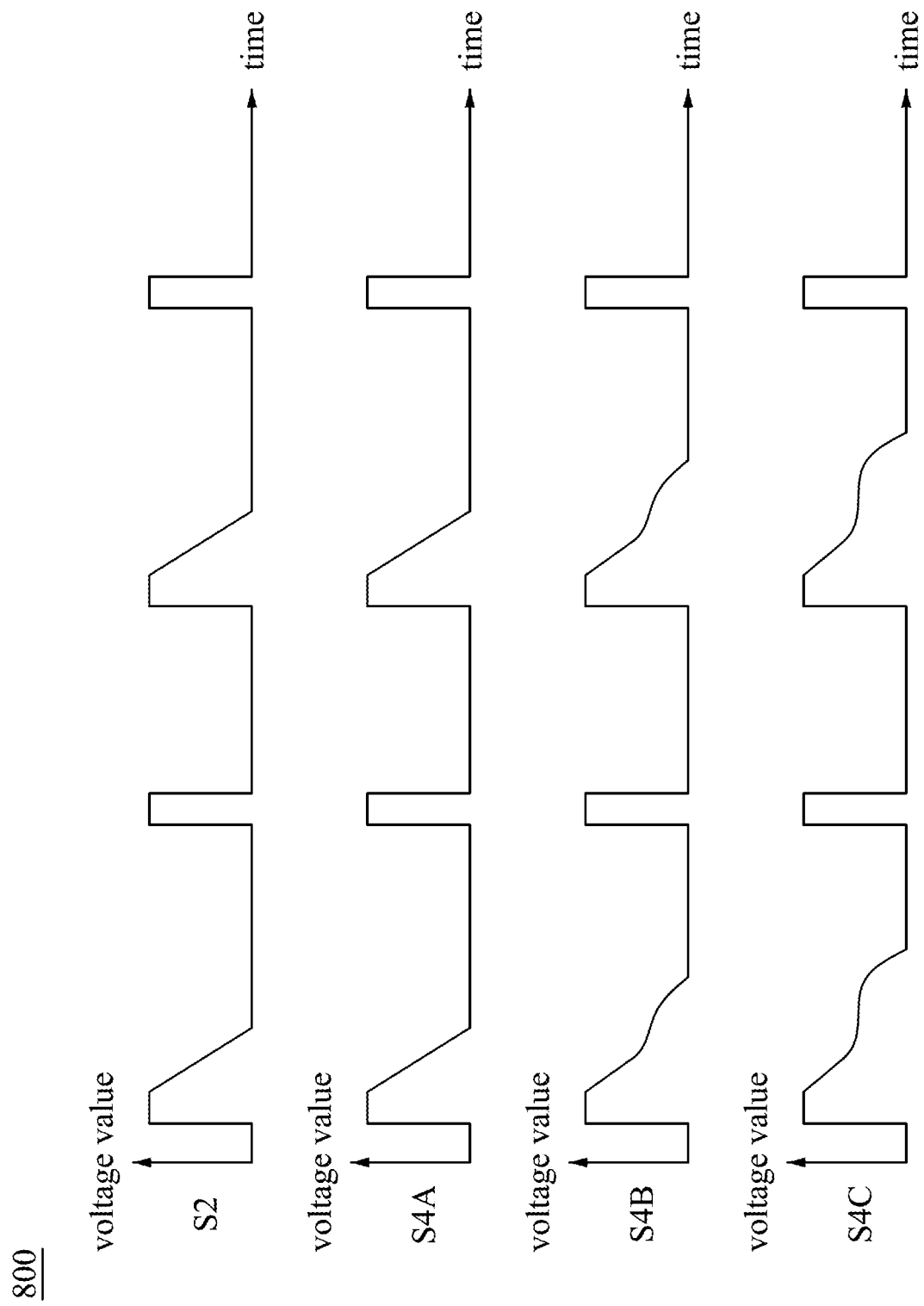
FIG. 8 is an experimental data diagram of a first signal and a driving signal in accordance with some embodiments of the present disclosure.

Reference is made to FIG. 8. FIG. 8 is an experimental data diagram 800 of a first signal S2 and a driving signal S4 in accordance with some embodiments of the present disclosure. The driving signal S4A is the voltage value of the measured driving signal S4 when the resistance value of the memory resistor Rpcm is the same as the resistance value of the reference resistance Rref. The driving signal S4B is the voltage value of the measured driving signal S4 when the resistance value of the memory resistor Rpcm is slightly larger than the resistance value of the reference resistance Rref. The driving signal S4C is the voltage value of the measured driving signal S4 when the resistance value of the memory resistor Rpcm is greater than the resistance value of the reference resistance Rref. As can be seen from FIG. 8, when the resistance value of the memory resistor Rpcm is the same as the resistance value of the reference resistance Rref, the voltage value of the driving signal S4 is the same as the voltage value of the first signal S2. When the resistance value of the memory resistor Rpcm is greater than the resistance value of the reference resistance Rref, the falling time duration of the driving signal S4 is longer than the falling time duration of the first signal S2, and the voltage value of the driving signal S4 is greater than the voltage value of the first signal S2.

As can be seen from the above, the embodiment of the present invention discloses a memory drive device, in particular, a driving device for writing in a phase change memory, in which the falling time of the driving voltage of the writing in operation and the falling time duration of the voltage value are adjusted according to the resistance value of the phase change memory. In addition, through the feedback circuit, the memory driving device of the present disclosure can self-correct the voltage value of the drive voltage of the write operation and the falling time duration to optimize the drive waveform of the write in operation and further improve the reliability and the success rate of the write operation.

Although the present disclosure has been described in considerable detail with reference to certain embodiments thereof, other embodiments are possible. Therefore, the spirit and scope of the appended claims should not be limited to the description of the embodiments contained herein.

What is claimed is:
1. A memory drive device, comprising:
a control circuit, configured to generate a first signal according to an input signal;
a reference voltage generation circuit, comprising a reference resistance, wherein the reference voltage gen- eration circuit is configured to generate a reference signal according to the first signal; and a first switch, coupled to a memory resistor, wherein the first switch is configured to generate a driving signal according to the reference signal to set a resistance value of the memory resistor;

wherein when the input signal is decreased and the resistance value of the memory resistor is larger than a resistance value of the reference resistance, a falling time of the driving signal is larger than a falling time of the reference signal.

2. The memory drive device of claim 1, wherein the control circuit comprises:

a second switch, wherein a control end of the second switch is coupled to the input signal, and a first end of the second switch is coupled to a working voltage;

a current source;

a capacitor; and an amplifier;

wherein a first end of the amplifier, a first end of the capacitor, a first end of the current source and a second end of the second switch are coupled to a first node.

3. The memory drive device of claim 1, wherein the control circuit comprises:

an inverter, wherein a first end of the inverter is configured to receive the input signal, and a second end of the inverter is coupled to a control end of a second switch.

4. The memory drive device of claim 2, wherein the reference voltage generation circuit further comprises:

a third switch, wherein a control end of the third switch is coupled to an output end of the amplifier, a first end of the third switch is coupled to the working voltage;

wherein a first end of the reference resistance, a second end of the amplifier and a second end of the third switch is coupled to a second node.

5. The memory drive device of claim 2, wherein a control end of the first switch is coupled to an output end of the amplifier, a first end of the first switch is coupled to the working voltage, a second end of the first switch and a first end of the memory resistor is coupled to a third node.

6. The memory drive device of claim 2, wherein when the second switch is turned on, the working voltage charges the capacitor through the second switch, and when the second switch is turned off, an electric charge stored in the capacitor is discharged through a current source, so as to decrease a voltage value of the first node; and when a voltage value of the first node is decreased, a voltage value of an output end of the amplifier is increased, a resistance value of the first switch and a resistance value of a third switch are increased, so as to decrease a voltage value of a second node and a voltage value of a third node.

7. The memory drive device of claim 1, further comprising:

a feedback circuit, configured to generate a compare signal according to the reference signal and the driving signal;

wherein the control circuit controls a voltage value of the first signal according to the compare signal.

8. The memory drive device of claim 7, wherein a first end of the feedback circuit receives the reference signal, a second end of the feedback circuit receives the driving signal, and an output end of the feedback circuit is coupled to the control circuit.

9. The memory drive device of claim 8, wherein the control circuit comprises:

a second switch, wherein a control end of the second switch is coupled to the input signal, and a first end of the second switch is coupled to a working voltage;

a fourth switch;

a current source, wherein a first end of the current source is coupled to a second end of the fourth switch;

a capacitor; and an amplifier;

wherein a first end of the amplifier, a first end of the capacitor, a first end of the fourth switch, and a second end of the second switch are coupled to a first node, and the output end of the feedback circuit is coupled to a control end of the fourth switch.

10. The memory drive device of claim 9, wherein the control circuit comprises:

an inverter, a first end of the inverter receives the input signal, a second end of the inverter is connected to the control end of the second switch.

* * * * *